US010262968B2

(12) United States Patent
Hayata et al.

(10) Patent No.: US 10,262,968 B2
(45) Date of Patent: Apr. 16, 2019

(54) WIRE BONDING APPARATUS AND WIRE BONDING METHOD

(71) Applicant: SHINKAWA LTD., Tokyo (JP)

(72) Inventors: Shigeru Hayata, Tokyo (JP); Satoshi Enokido, Tokyo (JP)

(73) Assignee: SHINKAWA LTD., Tokyo (JP)

(*) Notice: Subject to any disclaimer, the term of this patent is extended or adjusted under 35 U.S.C. 154(b) by 0 days.

(21) Appl. No.: 15/716,525

(22) Filed: Sep. 27, 2017

(65) Prior Publication Data

US 2018/0090464 A1  Mar. 29, 2018

Related U.S. Application Data

(63) Continuation of application No. PCT/JP2016/059067, filed on Mar. 22, 2016.

(30) Foreign Application Priority Data

Mar. 31, 2015  (JP) ................. 2015-072382

(51) Int. Cl.
| | |
|---|---|
| B23K 1/00 | (2006.01) |
| H01L 21/00 | (2006.01) |
| H01L 23/00 | (2006.01) |
| B23K 1/06 | (2006.01) |
| B23K 3/08 | (2006.01) |
| B23K 35/02 | (2006.01) |
| B23K 101/40 | (2006.01) |

(52) U.S. Cl.
CPC ............... *H01L 24/78* (2013.01); *B23K 1/06* (2013.01); *B23K 3/08* (2013.01); *B23K 35/0261* (2013.01); *B23K 2101/40* (2018.08); *H01L 2224/78621* (2013.01); *H01L 2224/78701* (2013.01); *H01L 2224/78702* (2013.01); *H01L 2224/78753* (2013.01)

(58) Field of Classification Search
CPC ....... H01L 2924/00; H01L 2224/85205; H01L 2224/859; H01L 24/48; H01L 24/49; H01L 24/78; H01L 24/85; H01L 2224/78; B23K 20/004; B23K 2101/40
See application file for complete search history.

(56) References Cited

U.S. PATENT DOCUMENTS

| | | | | |
|---|---|---|---|---|
| 5,485,398 A | * | 1/1996 | Yamazaki ............... | G01N 21/88 356/397 |
| 2003/0098426 A1 | * | 5/2003 | Hayata .................. | B23K 20/004 250/559.34 |
| 2011/0128369 A1 | * | 6/2011 | Sugawara ............ | B23K 20/007 348/87 |

FOREIGN PATENT DOCUMENTS

JP  3836479  10/2006

* cited by examiner

*Primary Examiner* — Erin B Saad
(74) *Attorney, Agent, or Firm* — JCIPRNET

(57) ABSTRACT

In order to easily and accurately measure an offset for wire bonding and improve precision of wire bonding, a wiring bonding apparatus includes a first imaging unit, a bonding tool, a moving mechanism, a reference member, a second imaging unit arranged on the opposite side to the bonding tool and the first imaging unit with respect to a reference surface, and a control unit. The first imaging unit detects a position of an optical axis of the first image capture unit with respect to a position of the reference member, the second imaging unit detects the position of the reference member when moving the bonding tool above the reference member according to pre-stored offset values, and detects a position of a ball-shaped tip section of a wire, and the control unit measures a change in offset between the bonding tool and the first imaging unit based on each detection result.

15 Claims, 15 Drawing Sheets

WIRE BONDING APPARATUS AND WIRE BONDING METHOD

CROSS REFERENCE TO RELATED APPLICATIONS

This application is a Continuation of PCT International Application No. PCT/JP2016/059067, filed on Mar. 22, 2016, which claims priority under 35 U.S.C § 119(a) to Patent Application No. 2015-072382, filed in Japan on Mar. 31, 2015, all of that are hereby expressly incorporated by reference into the present application.

TECHNICAL FIELD

The present invention relates to a wire bonding apparatus and a wire bonding method.

RELATED ART

In wire bonding for connecting a wire between a semiconductor chip and a circuit board, and the like, there is known to perform wire bonding by detecting the position of the semiconductor chip which is a bonding target from above with a camera and moving a bonding tool to that position. In this case, if an axial center of the bonding tool is provided to coincide with an optical axis of the camera, position detection by the camera is hindered by the bonding tool, and therefore the camera and the bonding tool are usually provided to be spaced from each other by a predetermined distance. Such a predetermined distance between the optical axis of the camera and the axial center of the bonding tool is referred to as an offset.

In wire bonding, since the bonding tool is positioned with respect to the bonding target on the basis of the offset, the offset is a very important parameter, and however, the offset is changed over time by a radiant heat from a bonding stage, heat generation in a surrounding optical system, wear by a moving mechanism for a bonding process, or the like, and therefore an accurate understanding of a change in such offset is required in wire bonding.

Moreover, if wire bonding is performed for a long time, dust or dirt adheres on the lower surface portion of the bonding tool. These contaminants such as dust get in the way, so it may sometimes be difficult to find the axial center (the center) of the bonding tool even if image processing is executed using the image taken by the camera.

By the way, in recent years, among cheap bonding tools, there are cases where an outside diameter axial center (the center) of the bonding tool and an inner hole axial center (the center) thereof do not always coincide and are eccentric, and where a free-air ball (FAB) itself formed at a tip of the bonding tool is eccentric from the axial center (the center) of the bonding tool, and therefore, a correct offset sometimes cannot be measured even on the basis of the outside diameter axial center (the center) of the bonding tool.

In the conventional art, although various configurations (for example, Patent Document 1 and the like) of measuring a change in offset are known, a focus position of the camera has to be adjusted to the height of an imaging target such as a reference in order to measure the change in offset by the camera, and therefore a mechanism and a method for measurement couldn't necessarily be said to be simple. In particular, in recent years, the number of the modes in which wire bonding is performed to a semiconductor chip in a stack structure increases, and it is desired that the offset is simply and accurately measured even in such a mode.

CITATION LIST

Patent Document

Patent Document 1: Japanese Patent Registration No. 3836479

SUMMARY OF THE INVENTION

Technical Problem

The present invention has been made in view of such a circumstance, and has an object to provide a wire bonding apparatus and a wire bonding method capable of simply and accurately measuring an offset for wire bonding and improving precision of wire bonding.

Solution to Problem

A wire bonding apparatus according to an aspect of the present invention includes: a first imaging unit which detects a position of a bonding target on a reference surface; a bonding tool provided to be spaced from the first imaging unit; a moving mechanism which integrally moves the bonding tool and the first imaging unit in a direction parallel to the reference surface; a reference member; a second imaging unit arranged on the opposite side to the bonding tool and the first imaging unit with respect to the reference surface; and a control unit which measures an offset between the bonding tool and the first imaging unit, in which, in the bonding tool, a wire is inserted therethrough and a ball-shaped tip section of the wire is extended out, the first imaging unit detects a position of an optical axis of the first imaging unit with respect to a position of the reference member, the second imaging unit detects the position of the reference member and detects a position of the ball-shaped tip section of the wire when moving the bonding tool above the reference member according to a previously stored offset value, and the control unit measures a change in the offset between the bonding tool and the first imaging unit based on each detection result of the first imaging unit and the second imaging unit.

In accordance with the above configuration, the second imaging unit arranged on the opposite side to the bonding tool and the first imaging unit with respect to the reference surface S detects the position of the reference member and detects the position of the ball-shaped tip section of the wire. Since the second imaging unit detects the position of the ball-shaped tip section, position detection is not hindered by, for example, foreign matter adhered to the bonding tool, and there is no problem in a decrease in precision due to deformation of the bonding tool which is an expendable item, and therefore a position in an XY axis direction of the bonding tool can be detected with few steps. Moreover, by the second imaging unit, the position of the ball-shaped tip section with respect to the position of the reference member can be measured more simply (for example, at the same time in one detection). Hence, the offset for wire bonding can be simply and accurately measured.

In the above wire bonding apparatus, the reference member may have a first mark to be detected by the first imaging unit, and a second mark to be detected by the second imaging unit.

In the above wire bonding apparatus, the first mark may be a tapered surface of the reference member.

In the above wire bonding apparatus, the first mark may be a step of the reference member.

In the above wire bonding apparatus, the reference member may have an opening bottom portion surrounded by the tapered surface or the step, and the second mark may be formed on the opening bottom portion.

In the above wire bonding apparatus, at the ball-shaped tip section of the wire, an irradiation unit which irradiates each slit light in an XY axis direction parallel to the reference surface from the opposite side to the bonding tool may be further included, and the control unit may measure the change in the offset between the bonding tool and the first imaging unit based on each slit light in the XY axis direction.

In the above wire bonding apparatus, the control unit may measure at least one of the diameter and the shape of the ball-shaped tip section of the wire extended out from the bonding tool.

In the above wire bonding apparatus, the reference member may have a light path length correcting unit, and the second imaging unit may detect the position of the ball-shaped tip section of the wire via the light path length correcting unit of the reference member.

In the above wire bonding apparatus, the control unit may provide feedback of the measured change in offset, and reflect it to next wire bonding.

In the above wire bonding apparatus, the previously stored offset value is the offset value measured at the last time by the control unit.

In the above wire bonding apparatus, the control unit may measure the oxidation level of the ball-shaped tip section of the wire based on the detection result of the second imaging unit.

In the above wire bonding apparatus, if the measured oxidation level is high, the control unit may provide feedback to a bonding parameter and reflect it to next wire bonding.

In the above wire bonding apparatus, the second imaging unit may detect the change associated with the movement of the ball-shaped tip section of the wire when moving the bonding tool in a vertical direction with respect to the reference surface.

A wire bonding method according to an aspect of the present invention is a method of wire bonding a position of a bonding target on a reference surface, and the method includes: a preparing step of a wire bonding apparatus including: a bonding tool provided to be spaced from a first imaging unit; a moving mechanism which integrally moves the bonding tool and the first imaging unit in a direction parallel to the reference surface; a reference member; a second imaging unit arranged on the opposite side to the bonding tool and the first imaging unit with respect to the reference surface; and a control unit which measures an offset between the bonding tool and the first imaging unit, a step of forming a ball-shaped tip section on a wire extended out from the bonding tool; a first detecting step of detecting a position of an optical axis of the first imaging unit with respect to a position of the reference member by the first imaging unit after moving the first imaging unit above the reference member, a second detecting step of detecting the position of the reference member and detecting a position of the ball-shaped tip section of the wire by the second imaging unit after moving the bonding tool above the reference member according to a previously stored offset value, and a measuring step of a change in the offset between the bonding tool and the first imaging unit based on each detection result of the first and second imaging units.

In accordance with the above configuration, the second imaging unit arranged on the opposite side to the bonding tool and the first imaging unit with respect to the reference surface S detects the position of the reference member and detects the position of the ball-shaped tip section of the wire. Since the second imaging unit detects the position of the ball-shaped tip section, position detection is not hindered by, for example, foreign matter adhered to the bonding tool, and there is no problem in a decrease in precision due to deformation of the bonding tool which is an expendable item, and therefore a position in an XY axis direction of the bonding tool can be detected with few steps. Moreover, by the second imaging unit, the position of the ball-shaped tip section with respect to the position of the reference member can be measured more simply (for example, at the same time in one detection). Hence, the offset for wire bonding can be simply and accurately measured.

Advantageous Effects of the Invention

In accordance with the present invention, an offset for wire bonding can be simply and accurately measured and precision of wire bonding can be improved.

DETAILED DESCRIPTION OF EMBODIMENTS OF THE INVENTION

Hereinafter, embodiments of the present invention will be described. In the following description of the drawings, identical or similar components are designated by the same or similar reference symbols. The drawings are illustrative only and the dimensions and geometries of various parts are schematic only, and the technical scope of the present invention should not be understood as being limited to the embodiments.

Figure 1:
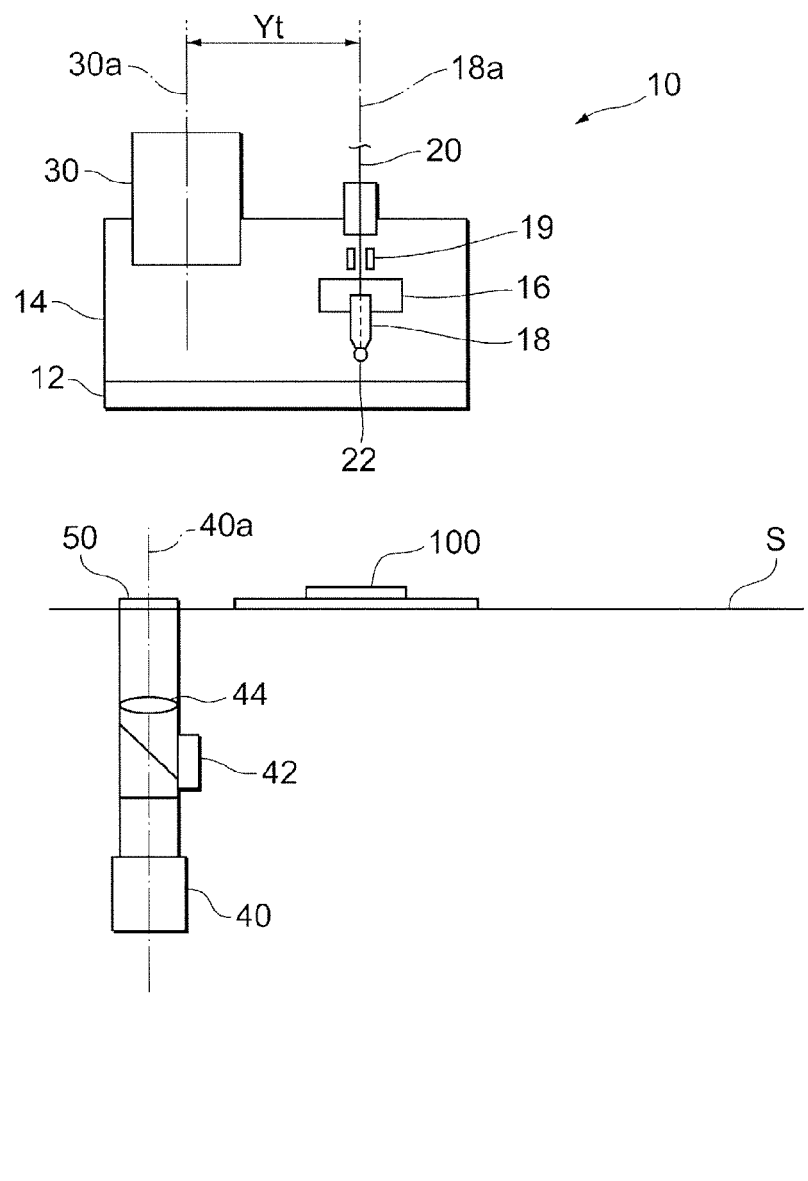
FIG. 1 is a view showing a wire bonding apparatus according to an embodiment of the present invention.
Figure 2:
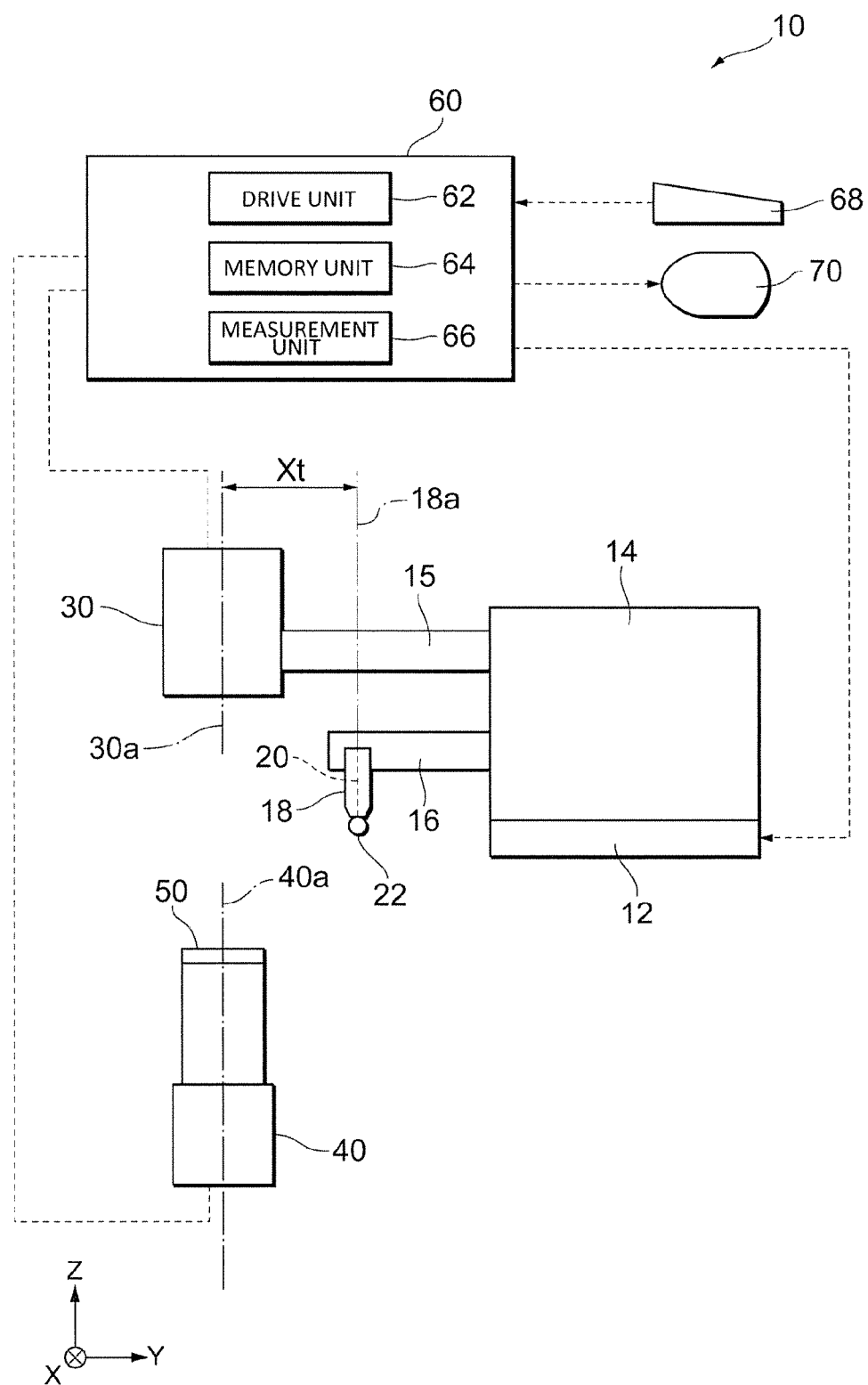
FIG. 2 is a view sowing the wire bonding apparatus according to the embodiment of the present invention.

FIG. 1 and FIG. 2 show a wire bonding apparatus 10 according to the present embodiment, FIG. 1 is a view viewed from a Y axis direction, and FIG. 2 is a view viewed from an X axis direction.

The wire bonding apparatus 10 includes an XY table 12, a bonding head 14, a bonding arm 16, a bonding tool 18, a first imaging unit 30, a second imaging unit 40, and a control unit 60 which performs processing required for wire bonding. It should be noted that, in the following description, an XY axis direction is described as a direction parallel to a reference surface S, and a Z axis direction is described as a direction perpendicular to the reference surface S.

The wire bonding apparatus 10 is an apparatus for performing a wire bonding method to a bonding target 100 on the reference surface S. By the wire bonding apparatus 10, of the bonding target 100, a first bonding point (for example, an electrode of a semiconductor chip) and a second bonding point (for example, an electrode of a circuit board) are electrically connected with a wire, and a semiconductor device is manufactured. The bonding target 100 is placed on a bonding stage (not shown) on the reference surface S, and the bonding target 100 is movable in the X axis direction, for example, by a conveyance moving mechanism such as a guide rail. A heating mechanism (not shown) is included in the bonding stage, and other component parts of the wire bonding apparatus 10 are subject to a radiant heat by the heating mechanism of the bonding stage.

In addition, the bonding target 100 may include a stack structure in which, for example, two or more semiconductor chips are layered in a state that each electrode pad thereof is exposed. The wire bonding apparatus and the wire bonding method according to the present embodiment can accurately perform wire bonding with an easy and simple configuration even in a case of a stack structure in which, for example, the heights of bonding points to be wire-bonded are different.

The XY table 12 is an example of a moving mechanism. The XY table 12 is configured to be slidable in the XY axis direction, and the bonding head 14 is mounted on the XY table. The bonding head 14 is provided with the bonding arm 16 via a Z axis drive mechanism (not shown) swingable in the Z axis direction, and the bonding tool 18 is attached to the tip of the bonding arm 16. Moreover, the bonding head 14 is provided with the first imaging unit 30 via a holder 15. Thus, the bonding head 14 is provided with the bonding tool 18 and the first imaging unit 30, thereby the bonding tool 18 and the first imaging unit 30 can be integrally moved in the XY axis direction by the XY table 12.

The bonding tool 18 is configured to insert a wire 20 therethrough along the Z axis direction. The bonding tool 18 is, for example, a capillary. The bonding arm 16 is provided with a transducer and an ultrasonic vibrator (not shown), thereby ultrasonic vibrations can be given to the bonding target 100 via the bonding tool 18. The bonding tool 18 has an insertion hole for inserting the wire 20 therethrough along the Z axis direction. Moreover, above the bonding tool 18, a wire clamper 19 is provided, and the wire clamper 19 is configured to restrain or release the wire 20 at predetermined timing. Moreover, during processing of a wire bonding step, at a tip section (a lower end portion in the Z axis direction) of the wire 20 inserted through the bonding tool 18, a ball-shaped tip section 22 may be formed. The material of the wire 20 is selected appropriately for cost, low electrical resistance, and the like, and for example, metallic material such as gold (Au), copper (Cu), or silver (Ag) is employed. The ball-shaped tip section 22 is referred to as a free-air ball (FAB), and this portion is bonded to the first bonding point of the bonding target 100.

An axial center 18a serving as a reference of alignment of the bonding tool 18 may be an axial center in the Z axis direction of the ball-shaped tip section 22, or may be an axial center of the insertion hole of the bonding tool 18.

The first imaging unit 30 is for detecting a position of the bonding target 100 on the reference surface S, and is a photoelectric conversion camera using, for example, a CCD (Charge Coupled Device). The first imaging unit 30 has an optical axis 30a along the Z axis direction. The first imaging unit 30 is arranged on the upper side (that is, on the same side as the bonding tool 18) in the Z axis direction with respect to the reference surface S, and acquires a predetermined range of the reference surface S as an image information from the upper side in the Z axis direction.

The bonding tool 18 and the first imaging unit 30 are provided to be spaced from each other. Concretely, the axial center 18a of the bonding tool 18 and the optical axis 30a of the first imaging unit 30 are provided at positions away from each other by a distance Xt in the X axis direction and a distance Yt in the Y axis direction. These distances Xt and Yt are referred to as offsets. It should be noted that details of the offset will be described later.

The second imaging unit 40 is arranged on the lower side (that is, on the opposite side to the bonding tool 18 and the first imaging unit 30 with respect to the reference surface S) in the Z axis direction with respect to the reference surface S, and acquires a predetermined range of the reference surface S as an image information from the lower side in the Z axis direction. The second imaging unit 40 is a camera similar to, for example, the first imaging unit 30. In the example shown in FIG. 1, the second imaging unit 40 has an optical axis 40a along the Z axis direction, and is provided with an illumination 42, a lens 44 (for example, a telecentric lens), and a reference member 50 along the optical axis 40a. These reference member 50 and the like provided in the second imaging unit 40 are configured integrally, and move integrally with the second imaging unit 40. It should be noted that details of the reference member 50 will be described later.

The control unit 60 is connected to each component of the wire bonding apparatus 10 such as the XT table 12, the first imaging unit 30, and the second imaging unit 40 to be capable of transmitting and receiving signals therebetween, and controls operations of these components. In the present embodiment, the control unit 60 includes a drive unit 62 which controls movement and the like of the XY table 12, the bonding tool 18, and the first imaging unit 30, a memory unit 64 which stores each image information and the like acquired by the first and second imaging units 30, 40, and a measurement unit 66 which measures the offset based on each image information stored in the memory unit 64. Each component of the control unit 60 will be described in detail in a wire bonding method described later.

Moreover, the control unit 60 is connected with an operation unit 68 for inputting a control information and a display unit 70 for outputting the control information, thereby an operator can input the required control information by the operation unit 68 while recognizing the screen by the display unit 70. In addition, the control unit 60 is a computer device including a CPU, a memory and the like, and a bonding program and other required information for performing processing required for wire bonding are previously stored in the memory. The control unit 60 is configured to perform each step for performing wire bonding described in the wire bonding method described later (for example, includes a program for causing the computer to perform each step).

Figure 3:
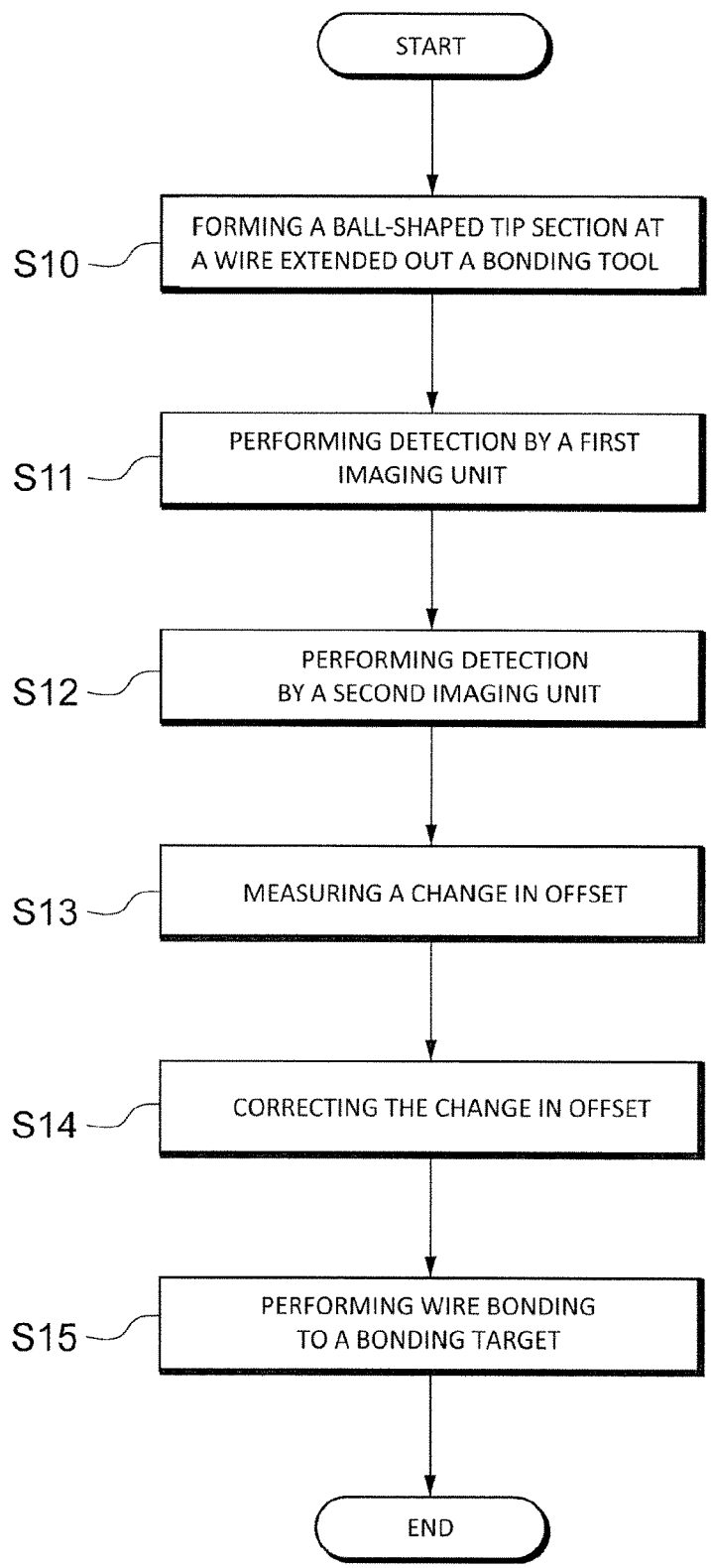
FIG. 3 is a flow chart showing a wire bonding method according to an embodiment of the present invention.
Figure 4:
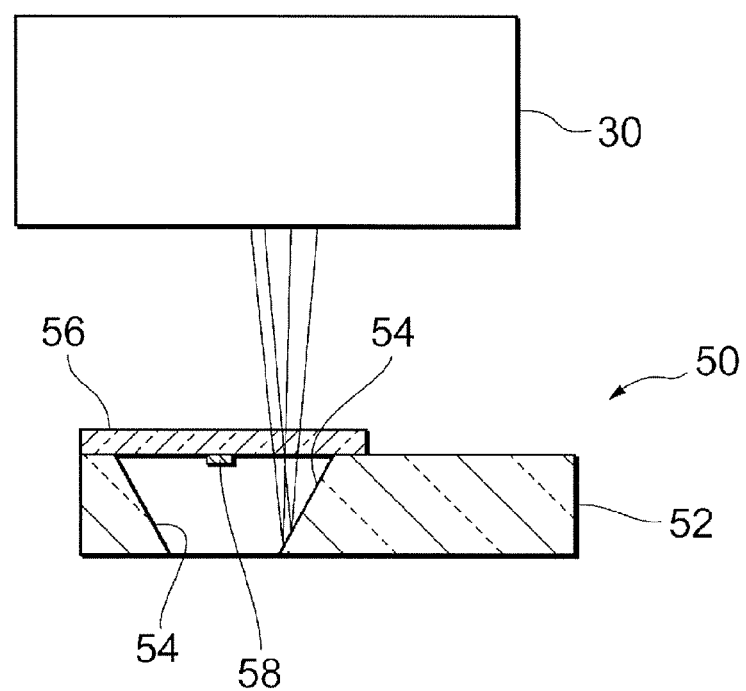
FIG. 4 is a view illustrating the wire bonding method according to the embodiment of the present invention.
Figure 5:
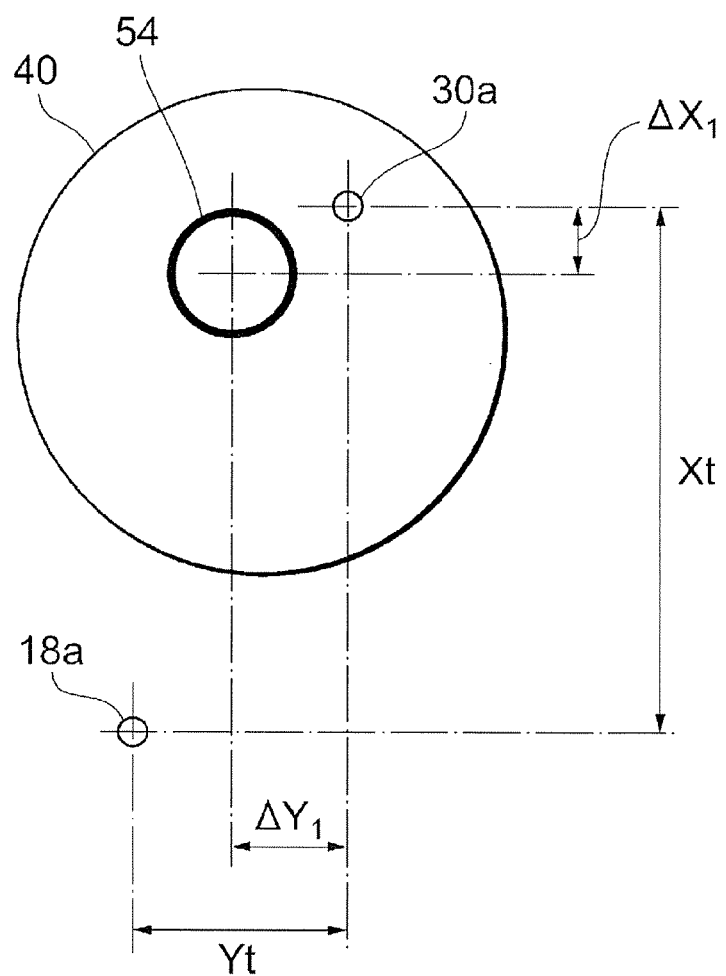
FIG. 5 is a view illustrating the wire bonding method according to the embodiment of the present invention.
Figure 6:
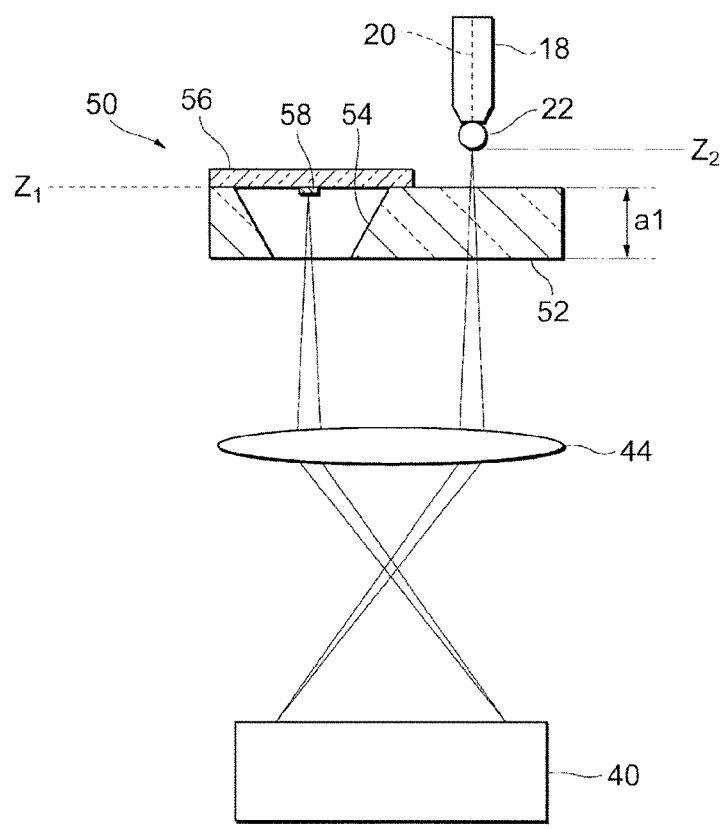
FIG. 6 is a view illustrating the wire bonding method according to the embodiment of the present invention.
Figure 7:
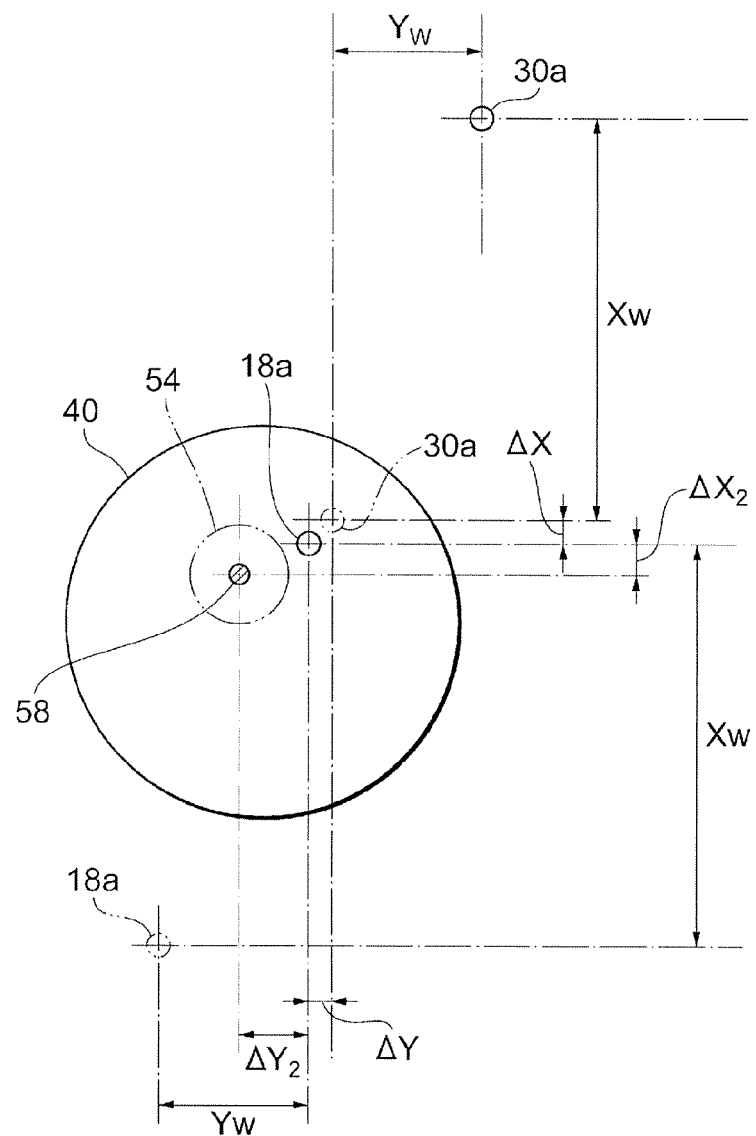
FIG. 7 is a view illustrating the wire bonding method according to the embodiment of the present invention.

Next, with reference to FIG. 3 to FIG. 7, the wire bonding method according to the present embodiment will be described. Here, FIG. 3 is a flow chart showing the wire bonding method according to the present embodiment. Moreover, FIG. 4 to FIG. 7 are for illustrating the wire bonding method according to the present embodiment, and concretely, FIG. 4 and FIG. 5 show a detecting step by the first imaging unit, and FIG. 6 and FIG. 7 show a detecting step by the second imaging unit.

After preparing the above wire bonding apparatus 10, the ball-shaped tip section 22 is formed at the portion extended out the bonding tool 18, of the wire 20 inserted through the bonding tool 18 (S10). A forming step of the ball-shaped tip section 22 is performed, for example, by bringing a tip of the wire 20 extended out from the lower end side in a vertical direction of the bonding tool 18 close to a torch electrode (not shown) applied to a predetermined high voltage to generate discharge therebetween, and thereby fusing the tip of the heated wire.

Next, detection by the first imaging unit 30 is performed (S11). Concretely, the XY table 12 is moved by the drive unit 62 and arranged above the reference member 50, and the first imaging unit 30 detects a position of the optical axis 30a of the first imaging unit 30 with respect to a position of the reference member 50. Detection data by the first imaging unit 30 are stored in the memory unit 64.

The reference member 50 has at least one mark (a discrimination part) which can be detected by the first imaging unit 30 and the second imaging unit 40. The reference member 50 is formed of, for example, a light transmissive material such as glass. In the example shown in FIG. 4, the reference member 50 has a base 52 and a cover 56, and the base 52 is an example of a light path length correcting unit. The base 52 and the cover 56 are formed into a substantially plate shape. An opening hole is formed in the base 52, a tapered surface 54 inclined to the Z axis direction is formed within the opening hole, and the tapered surface 54 serves as a first mark to be detected by the first imaging unit 30. Moreover, on the cover 56, a metallic film 58 is formed, for example, by vapor deposition or sputtering, and the metallic film 58 serves as a second mark to be detected by the second imaging unit 40. The metallic film 58 which is the second mark is formed on the lower surface side of the cover 56, therefore adhesion of foreign matter and the like to the metallic film 58 is prevented. Moreover, in the example shown in FIG. 4, on an opening bottom portion (the cover 56) surrounded by the tapered surface 54 which is the first mark of the reference member 50, the metallic film 58 which is the second mark is formed. Thus, the first mark and the second mark are provided close to each other, thereby a change in the distance between the marks can be substantially ignored even if the reference member 50 itself is thermally expanded due to a radiant heat or the like. Alternatively, one mark formed on the reference member 50 may be used for both detections by the first imaging unit 30 and the second imaging unit 40. It should be noted that the configurations of the first and second marks are not limited to the above mode as long as they can be detected by the corresponding imaging units. For example, the second mark is not limited to the metallic film, and may be a mark-off line or a paint drawn on the base 52, or may be a hole. Moreover, the reference member 50 is not limited to those configured separately from the base 52 and the cover 56, and they may be integrally formed.

A position of the tapered surface 54 of such reference member 50 is detected by the first imaging unit 30. The tapered surface 54 is inclined to the optical axis in the Z axis direction of the first imaging unit 30, therefore the position of the reference member 50 can be detected by the first imaging unit 30 even if a focus position in the Z axis direction of the first imaging unit 30 is changed. In particular, in the semiconductor device in a stack structure, the focus position in the Z axis direction of the first imaging unit 30 is frequently changed, and therefore it is effective to apply the present embodiment thereto.

Thus, as shown in FIG. 5, the position of the optical axis 30a of the first imaging unit 30 with respect to the position (for example, the center of a ring of the tapered surface 54) of the reference member 50 is detected. Here, although the optical axis 30a of the first imaging unit 30 may be aligned with the center of the ring of the tapered surface 54 of the reference member 50, the optical axis 30a of the first imaging unit 30 may be moved to a position which does not coincide with the center of the ring of the tapered surface 54, as shown in FIG. 5, because it is only necessary that both relative positions can be detected. In this way, distances ΔX1 and ΔY1 between the optical axis 30a of the first imaging unit 30 and the center of the ring of the tapered surface 54 are measured. At this time, the axial center 18a of the bonding tool 18 is located outside the visual field of the first imaging unit 30 offset by distances Xt and Yt from the optical axis 30a of the first imaging unit 30.

Next, detection by the second imaging unit 40 is performed (S12). Concretely, firstly, by driving the XY table 12 by means of the drive unit 62, the axial center 18a of the bonding tool 18 is moved by predetermined distances Xw and Yw toward the reference member 50, thereby the bonding tool 18 is arranged above the reference member 50 such that, as shown in FIG. 7, the axial center 18a of the bonding tool 18 comes in the visual field of the second imaging unit 40. Here, the distances Xw and Yw are previously stored in the memory unit 64 before the detecting step (S12) by the second imaging unit 40, and concretely, correspond to the measured offsets, or the offsets measured at the last time (hereinafter, these are referred to as "the last time measured offsets"), in a system initial condition when turning on the wire bonding apparatus 10. Temporarily, if the offset between the bonding tool 18 and the first imaging unit 30 is not changed over time and remains in the last time measured offset, by moving the bonding tool 18 toward the reference member 50, the axial center 18a of the bonding tool 18 will coincide with the optical axis 30a of the first imaging unit 30 before movement of the bonding tool 18. However, actually, since the offset is changed over time due to various factors associated with continuation of processing of wire bonding, they do not coincide with each other and are arranged to be shifted, thereby a change in offset is brought about.

FIG. 6 shows a detection mode by the second imaging unit 40. After arranging the bonding tool 18 above the reference member 50 by lowering it along the Z axis direction, the second imaging unit 40 detects a position of the metallic film 58 as the second mark of the reference member 50, and a position of the ball-shaped tip section 22 which is the axial center 18a of the bonding tool 18. That is, the second imaging unit 40 detects the position of the axial center 18a of the bonding tool 18 with respect to the position of the reference member 50. Detection data by the second imaging unit 40 are stored in the memory unit 64.

The second imaging unit 40 is configured such that its focus position matches at least one of the metallic film 58 of the reference member 50 and the ball-shaped tip section 22 which is the axial center of the bonding tool 18. In a case where a height Z2 of the ball-shaped tip section 22 of the bonding tool 18 is arranged above in the Z axis direction away from the second imaging unit 40 than a height Z1 of the metallic film 58 of the reference member 50, if light paths for detecting them pass through the same medium, the focus position is shifted from the other when it is matched to one of them. Then, in the present embodiment, the position of the ball-shaped tip section 22 of the bonding tool 18 is detected via the base 52 which is the light path length correcting unit of the reference member 50, thereby correcting focus misalignment associated with a difference in heights. For example, as shown in FIG. 6, if the light path from the second imaging unit 40 to the metallic film 58 passes through the atmosphere and the light path from the second imaging unit 40 to the ball-shaped tip section 22 passes through the base 52 made of glass having a thickness a1 (a refractive index n of the medium of the light path length correcting unit), a focus misalignment amount $\Delta$ becomes $\Delta \approx a (1-1/n)$, the difference in heights is corrected by appropriately adjusting the focus misalignment amount, and the position of the axial center 18a of the bonding tool 18 with respect to the position of the reference member 50 can be detected simultaneously. Thus, as shown in FIG. 7, distances $\Delta X2$ and $\Delta Y2$ between the axial center 18a of the bonding tool 18 and the metallic film 58 as the second mark of the reference member 50 are measured.

Next, based on each detection result of the first imaging unit 30 and the second imaging unit 40, the measurement unit 66 measures the change in the offset between the axial center 18a of the bonding tool 18 and the optical axis 30a of the first imaging unit 30 (S13). Here, the changes ($\Delta X$ and $\Delta Y$) in the offsets have the following relationship with respect to the last time measured offsets (Xw and Yw) stored in the memory unit 64 and the actual offsets (Xt and Yt).

$$Xt = Xw + \Delta X \quad Yt = Yw + \Delta Y$$

Then, $\Delta X$ and $\Delta Y$ have the following relationships with respect to the measurements ($\Delta X1$ and $\Delta Y1$) by the first imaging unit 30 and the measurements ($\Delta X2$ and $\Delta Y2$) by the second imaging unit 40.

$$\Delta X = \Delta X1 - \Delta X2 \quad \Delta Y = \Delta Y1 - \Delta Y2$$

In this way, after measuring the change in offset by the measurement unit 66, the change in offset is corrected (S14). Concretely, the data of the last time measured offset stored in the memory unit 64 is corrected to the data of the actual offset in consideration of the change in offset. Thus, the offset between the bonding tool 18 and the first imaging unit 30 can be accurately and easily measured and corrected. Then, feedback of the measured change in offset is provided, and based on the correct offset value, wire bonding is performed to the bonding target 100 (S15). In addition, such a series of measuring and correcting steps of the offset are repeatedly performed in a certain cycle in the wire bonding step, and can appropriately respond to the change over time in the offset that may occur during a manufacturing step.

Figure 8:
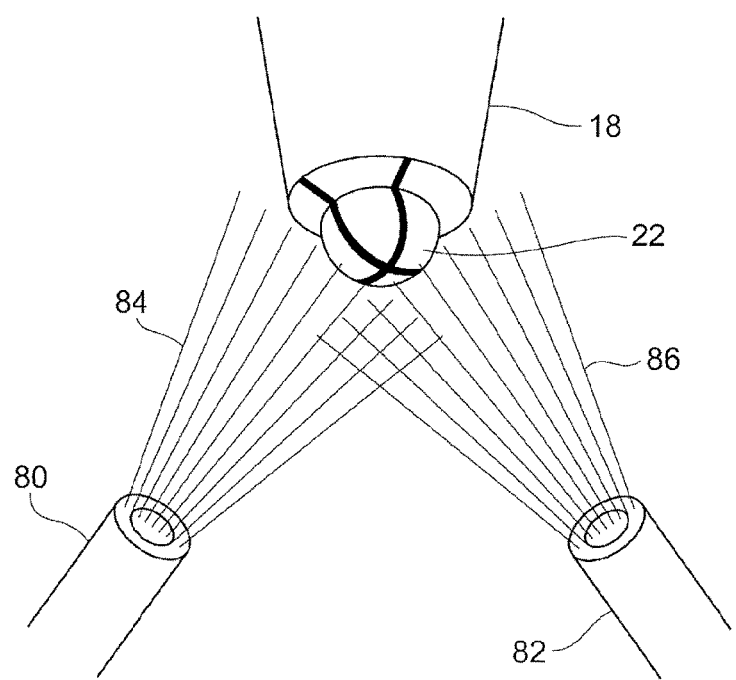
FIG. 8 is a view illustrating the wire bonding method according to the embodiment of the present invention.

In the above measuring step (S13) of the change in offset, when the second imaging unit 40 measures the change in offset, in order to grasp the relative position of the center of the ball-shaped tip section 22 with respect to an external form of the bonding tool 18, as shown in FIG. 8, laser slit lights 84, 86 from irradiation units 80, 82 arranged on the Z-axis lower side with respect to the reference surface S may be irradiated to the ball-shaped tip section 22 of the bonding tool 18. The irradiation units 80, 82 may be movable integrally with the second imaging unit 40, or may be fixed thereto. In any case, the irradiation units 80, 82 irradiate the slit lights 84, 86 toward the ball-shaped tip section 22 of the bonding tool 18 which was moved by the distances Xw and Yw which are the last time measured offsets. In the wire bonding apparatus 10, if an object is imaged from the lower side, the external shape or the ball-shaped tip section 22 (FAB) of the bonding tool 18 cannot be sometimes clearly recognized, but, by thus irradiating the slit lights 84, 86, changing points of the slit light on the ball-shaped tip section 22 can be detected in image processing by means of an optical cutting method. Thus, the relative position of the center of the ball-shaped tip section 22 with respect to the external shape of the bonding tool 18 can be grasped, and the change in offset can be measured more easily and accurately.

Figure 9:
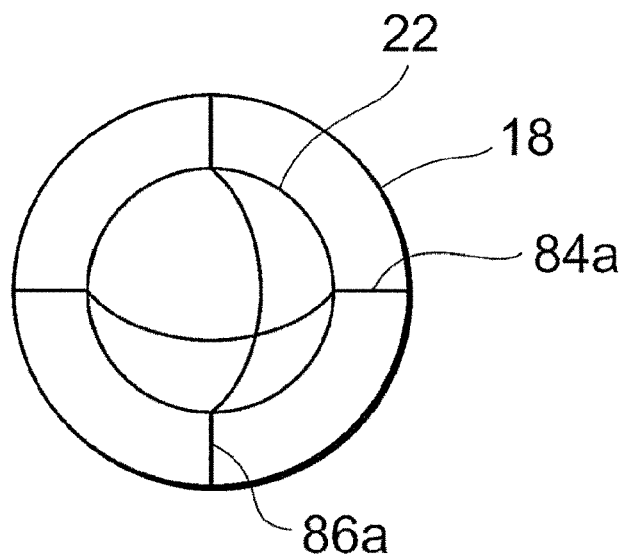
FIG. 9(A) and FIG. 9(B) are views illustrating the wire bonding method according to the embodiment of the present invention.
Figure 9:
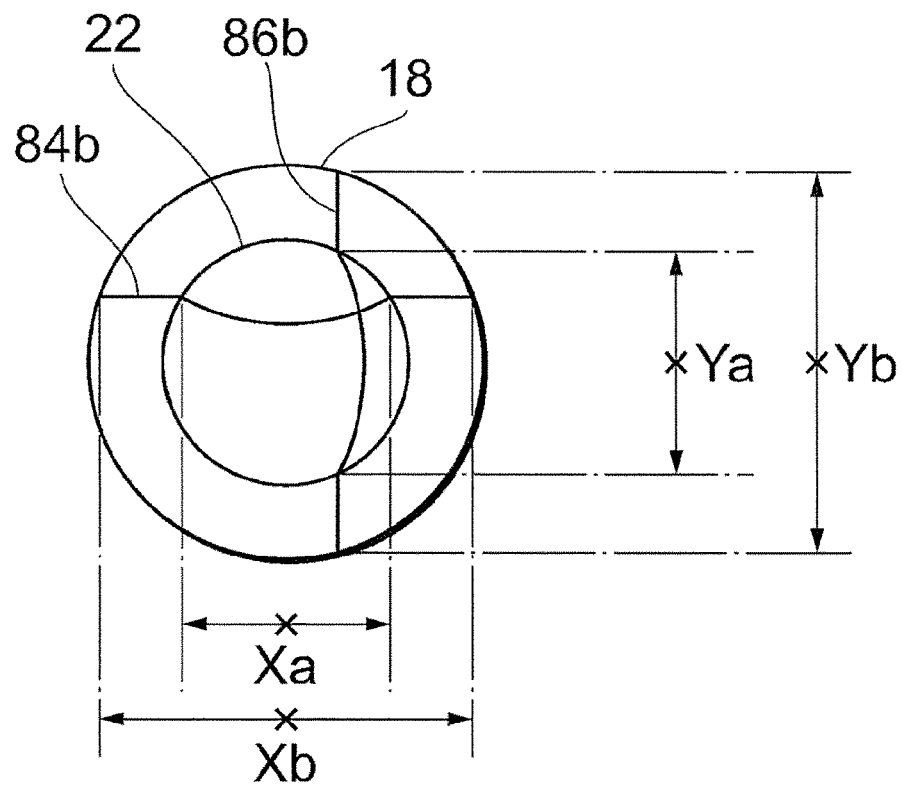
Figure 10:
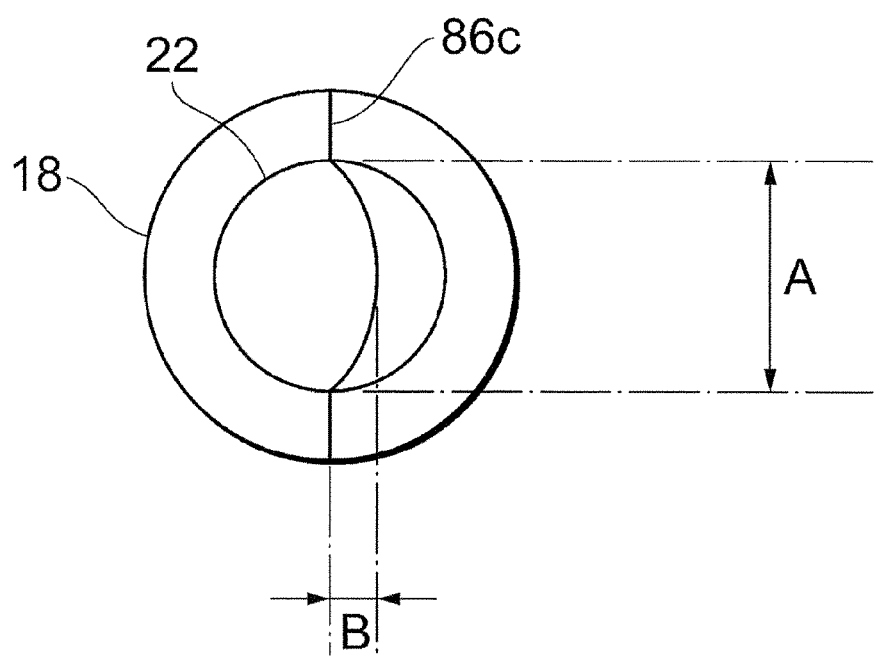
FIG. 10 is a view illustrating the wire bonding method according to the embodiment of the present invention.

Further, specifically, if the change in offset is temporarily zero, as shown in FIG. 9(A), an intersection point of a slit light 84a in the X axis direction and a slit light 86a in the Y axis direction coincides with the axial center in the Z axis direction of the ball-shaped tip section 22 (or an end surface on the lower end portion side of the bonding tool 18). In contrast, if the change in offset occurs, as shown in FIG. 9(B), an intersection point of a slit light 84b in the X axis direction and a slit light 86b in the Y axis direction does not coincide with the axial center in the Z axis direction of the ball-shaped tip section 22 (or the end surface on the lower end portion side of the bonding tool 18) and is arranged to be shifted. However, also in this case, changing points of each slit light due to an outer edge of the end surface on the lower end side of the bonding tool 18 and an outer edge of the ball-shaped tip section 22 can be recognized by the second imaging unit 40, whereby the positions of the axial centers (Xa, Ya) of the ball-shaped tip section 22 and the axial centers (Xb, Yb) of the bonding tool 18 can be detected. Thereby, the change in offset can be measured more easily and accurately.

Moreover, after measuring the change in offset, the axial center 18a of the bonding tool 18 is moved to an accurate position (that is, moved by $\Delta X$ and $\Delta Y$), and thereafter, slit lights 84c, 86c are irradiated to the ball-shaped tip section 22 of the bonding tool 18, and the diameter and the shape of the ball-shaped tip section 22 may be measured by the second imaging unit 40 based on each slit light. For example, a distance A between the changing points of the slit light 86c due to the outer edge of the ball-shaped tip section 22 is measured, thereby the diameter of the ball-shaped tip section 22 may be detected. Moreover, for example, a distance B to an apex of a spherical surface of the ball-shaped tip section 22 is measured, thereby the shape (that is, a deformation degree) of the ball-shaped tip section 22 may be detected.

In the above detecting step (S12) by the second imaging unit 40, the measurement unit 66 can measure the oxidation level of the ball-shaped tip section 22. In particular, if the wire 20 is made of copper, the ball-shaped tip section 22 may be oxidized, and the color of the wire is changed when the ball-shaped tip section 22 is oxidized. Therefore, the change in color of the ball-shaped tip section 22, that is, the change in reflectance of the ball-shaped tip section 22 in a specific wavelength is detected by the second imaging unit 40, thereby the oxidation level of the ball-shaped tip section 22 can be measured.

Figure 11:
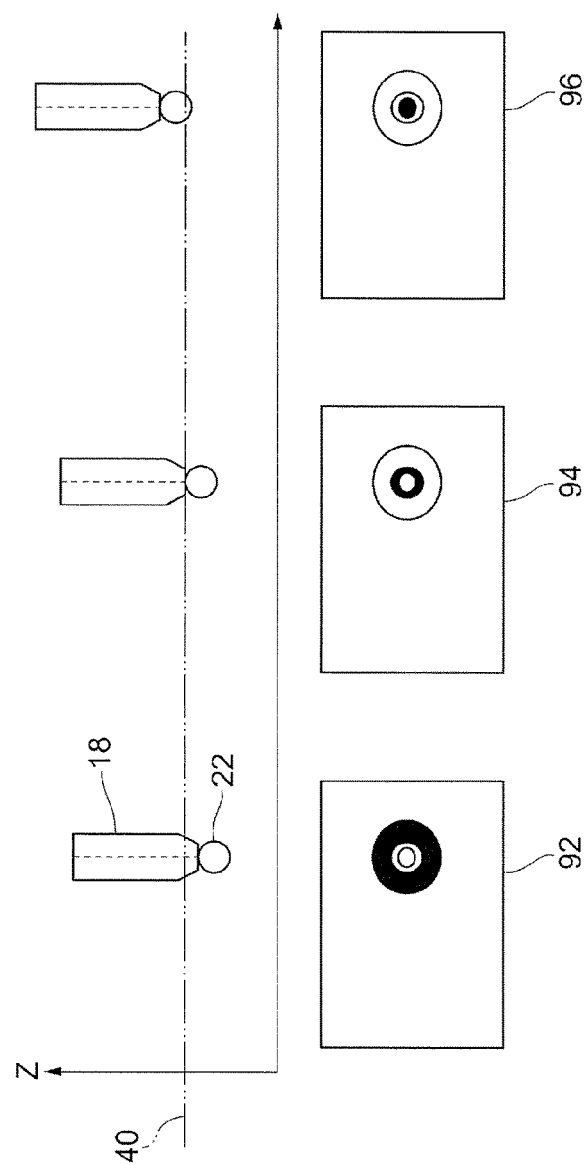
FIG. 11 is a view illustrating the wire bonding method according to the embodiment of the present invention.

In this case, the second imaging unit 40 may, by the use of a monochromatic camera, take an image multiple times by switching the illumination to red, green, blue or the like by means of an LED, a color filter or the like, or may lake an image by the use of a color camera. Moreover, in the wire bonding apparatus 10, if an object is imaged from the lower side, there is a case where the position of the ball-shaped tip section 22 (FAB) does not coincide with a focus position 90 of the second imaging unit 40 and is shifted, but, in this case, the bonding tool 18 is moved in the up and down direction along the Z axis direction so that the ball-shaped tip section 22 of the bonding tool 18 coincides with the focus position 90 with respect to the second imaging unit 40, and thereby an image information of the ball-shaped tip section 22 can be acquired by the second imaging unit 40. In the example shown in FIG. 11, three patterns of positions in Z axis direction of the bonding tool 18 with respect to the focus position 90 are shown, and each corresponding image information 92, 94, 96 of the second imaging unit 40 is shown. In the image information 92, 94, 96, a black-colored portion corresponds to the focus position 90, and by thus moving the bonding tool 18 to detect the change of the ball-shaped tip section 22 associated with the movement, the ball-shaped tip section 22 can be finally recognized by the image information 96.

In addition, the oxidation level of the ball-shaped tip section 22 is measured in this way, and if the measured oxidation level exceeds a certain threshold, by changing bonding parameters (for example, a heating temperature of the ball-shaped tip section 22, a flow setting of a reducing gas, and the like), feedback of the control thereof can be provided during the wire bonding step.

As thus described, in accordance with the present embodiment, the second imaging unit 40 arranged on the opposite side to the bonding tool 18 and the first imaging unit 30 with respect to the reference surface S detects the position of the reference member 50 and detects the position of the ball-shaped tip section 22 of the wire 20. Since the second imaging unit 40 detects the position of the ball-shaped tip section 22, position detection is not hindered by, for example, foreign matter adhered to the bonding tool 18, and there is no problem in a decrease in precision due to deformation of the bonding tool 18 which is an expendable item, and therefore a position in an XY axis direction of the bonding tool 18 can be detected with few steps. Moreover, by the second imaging unit 40, the position of the ball-shaped tip section 22 with respect to the position of the reference member 50 can be measured more simply (for example, at the same time in one detection). Hence, the offset for wire bonding can be simply and accurately measured.

Moreover, since the ball-shaped tip section 22 of the wire 20 is detected from the opposite side (that is, the lower side in the Z axis direction) with respect to the reference surface S, even if the ball-shaped tip section 22 is too small to protrude from the end surface on the lower side of the bonding tool 18, the ball-shaped tip section 22 can be easily detected. Besides, since the second imaging unit 40 can detect and measure the diameter and the shape of the ball-shaped tip section 22, or even the oxidation level thereof, high-precision wire bonding with high bondability can be performed.

The present invention is not limited to the above embodiments, but can be modified to be applied in various ways. FIG. 12, FIG. 13, FIG. 14(A), FIG. 14(B), and FIG. 15 are views showing each modified example of the reference member. Hereinafter, the differences from the above embodiment will be described.

Figure 12:
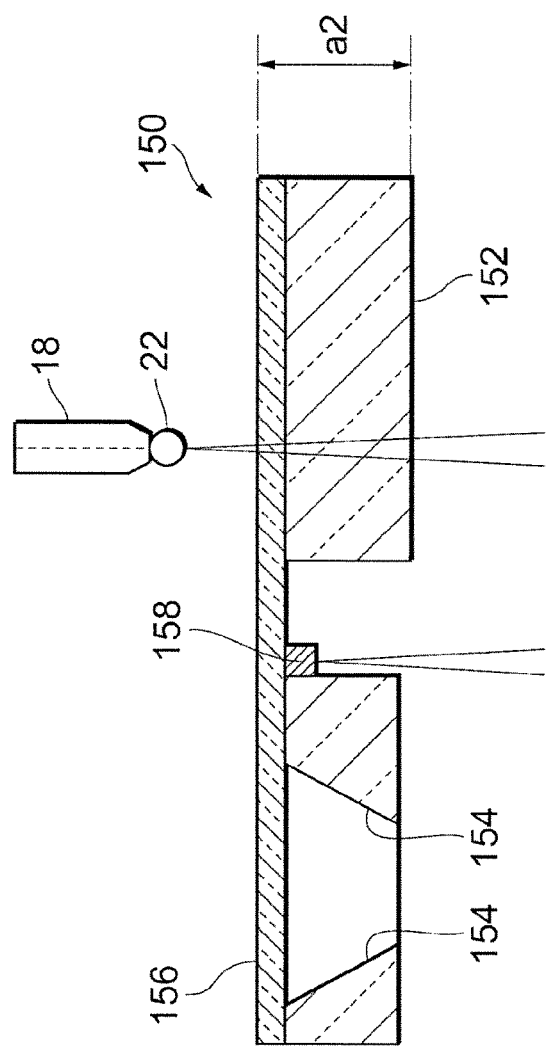
FIG. 12 is a view showing a modified example of an embodiment of the present invention.

In the modified example shown in FIG. 12, a reference member 150 has a base 152 and a cover 156, and a metallic film 158 which is the second mark is formed outside the range surrounded by a tapered surface 154 which is the first mark. Even in such a mode, the first mark and the second mark can be provided close to each other. Moreover, the cover 156 extends out so as to reach onto the base 152 which is an example of the light path length correcting unit, and the light path from the second imaging unit to the ball-shaped tip section 22 is configured to pass a combined thickness a2 of the base 152 and the cover 156.

Figure 13:
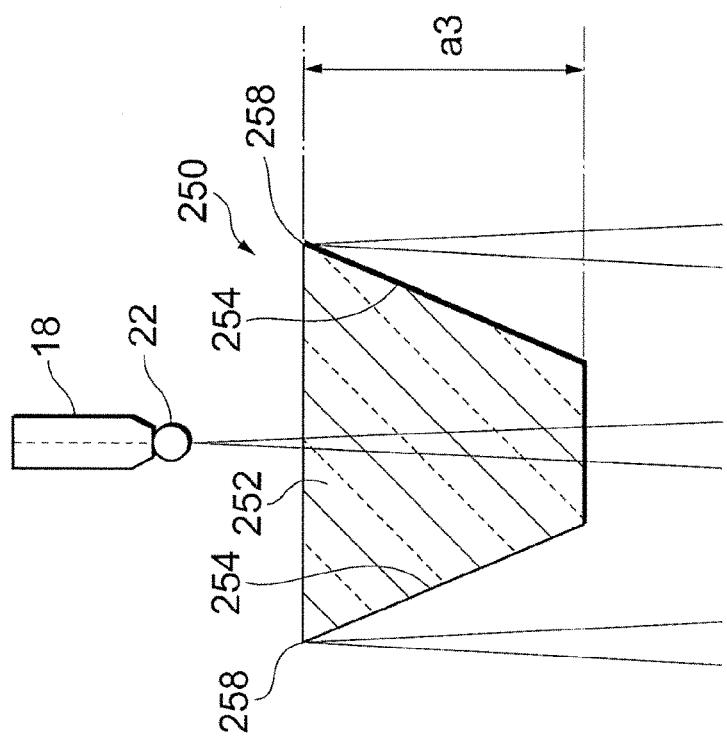
FIG. 13 is a view showing a modified example of the embodiment of the present invention.

In the modified example shown in FIG. 13, a reference member 250 has a base 252 in a conical shape, a pyramid shape or the like, an outer wall side surface of the base 252 is formed as a tapered surface 254 which is the first mark, and an outer edge 258 (a side of the upper surface or an apex of the base 252) functions as the second mark. The light path from the second imaging unit to the ball-shaped tip section 22 is configured so as to pass a thickness a3 of a substantially central portion of the base 252. In addition, as shown in the figure, the tapered surface 254 which is the first mark may be a forward taper in a direction in which the area of the lower surface of the base 252 is decreased compared to that of the upper surface thereof, or may be a backward taper in the opposite direction thereto.

Figure 14:
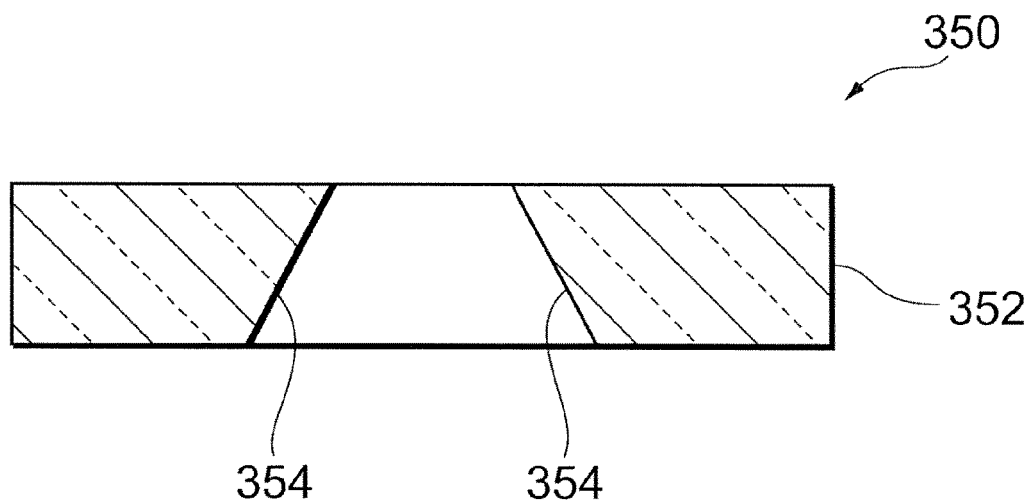
FIG. 14(A) and FIG. 14(B) are views showing the modified example of the embodiment of the present invention.
Figure 14:
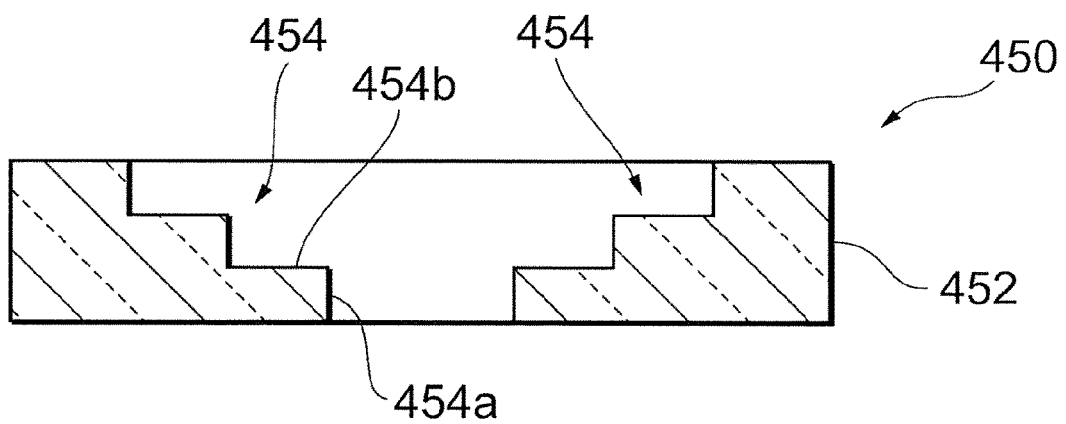
Figure 15:
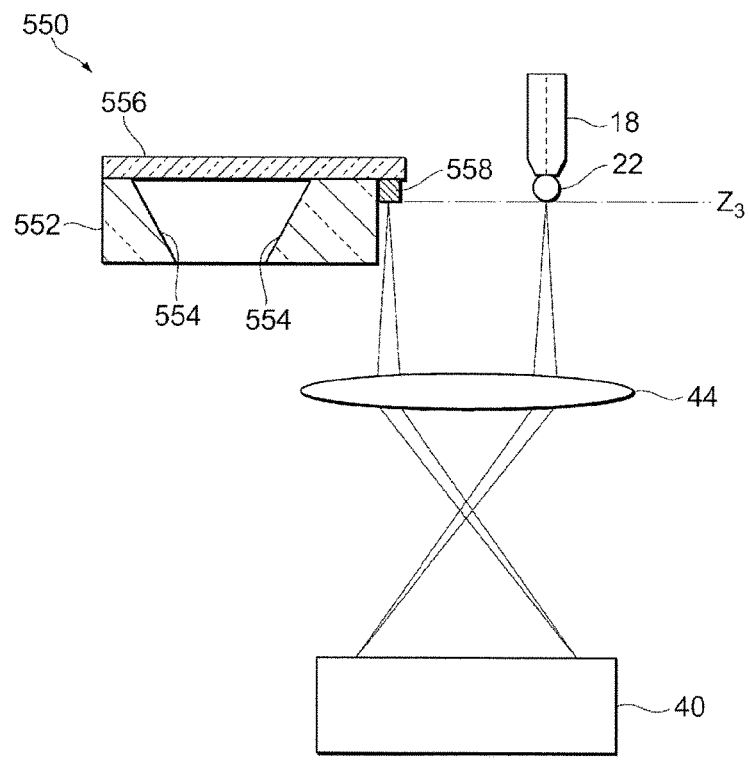
FIG. 15 is a view showing the modified example of the embodiment of the present invention.

As shown in FIG. 14(A) and FIG. 14(B), various configurations can be applied also to the first mark. In the modified example shown in FIG. 14(A), a reference member 350 has a base 352, an opening hole is formed in the base 352, and a tapered surface 354 which is a backward taper is formed within the opening hole. The tapered surface 354 is inclined to a direction in which the opening hole is widened to the lower side in the Z axis direction. Alternatively, the first mark is not limited to the tapered surface, and as shown in FIG. 14(B), may be a step 454. In the modified example shown in FIG. 14(B), a reference member 450 has a base 452, an opening hole is formed in the base 452, and the step 454 is formed within the opening hole. The step 454 has a first surface 454a parallel to the Z axis direction, and second surfaces 454b intersecting (for example, perpendicular to) the Z axis direction, and provision of a plurality of second surfaces 454b can respond to different focus positions in the Z axis direction of the first imaging unit 30.

In the above embodiments, although the mode for detecting the axial center of the bonding tool 18 via the reference member having the light path length correcting unit has been described, the present invention is not limited thereto. That is, as shown in the modified example of FIG. 15, the second imaging unit 40 may detect the position of the ball-shaped tip section 22 of the bonding tool 18 without a reference member 550 (a light path length correcting unit). Here, the reference member 550 has a cover 552 and a cover 556, and a metallic film 558 which is the second mark is formed outside the range surrounded by a tapered surface 554 which is the first mark. The second imaging unit 40, without the reference member 550, detects the position of the ball-shaped tip section 22 of the bonding tool 18, and detects the position of the metallic film 558 which is the second mark. In this case, the bonding tool 18 is lowered to a height Z3 which is the focus position of the second imaging unit 40 by driving the bonding tool 18 in the Z axis direction by means of the drive unit 62, and the detecting step by the second imaging unit 40 may be performed in a state that the ball-shaped tip section 22 and the metallic film 558 of the reference member 550 are aligned with the same height Z3. Thereby, the configuration of the reference member can be further simplified. Moreover, in the wire bonding apparatus 10, Z-axis driving of the bonding tool 18 is easy, and therefore focus alignment can be easily performed.

The modes for implementation described through the above embodiments of the invention can be combined appropriately depending on the intended use or can be changed or improved for use, and the present invention is not limited to the description of the above-mentioned embodiments. It is obvious from the description of the claims that such combined, changed, or improved modes could also be included within the technical scope of the present invention.

REFERENCE SIGNS LIST

10 Wire bonding apparatus
18 Bonding tool
20 Wire
22 Ball-shaped tip section
30 first imaging unit
40 Second imaging unit
50 Reference member
54 Tapered surface (First mark)
58 Metallic film (Second mark)
60 Control unit
80, 82 Irradiation unit
84, 86 Slit light

What is claimed is:

1. A wire bonding apparatus, comprising:
a first imaging unit, configured to detect a position of a bonding target on a reference surface;
a bonding tool, provided to be spaced from the first imaging unit;
a moving mechanism, configured to integrally move the bonding tool and the first imaging unit in a direction parallel to the reference surface;
a reference member;
a second imaging unit, arranged on the opposite side to the bonding tool and the first imaging unit with respect to the reference surface; and
a control unit, configured to measure an offset between the bonding tool and the first imaging unit, wherein
in the bonding tool, a wire is inserted therethrough, and a ball-shaped tip section of the wire is extended out,
the first imaging unit detects a position of an optical axis of the first imaging unit with respect to a position of the reference member,
the second imaging unit detects the position of the reference member and detects a position of the ball-shaped tip section of the wire when moving the bonding tool above the reference member according to a previously stored offset value, and
the control unit measures a change in the offset between the bonding tool and the first imaging unit based on each detection result of the first imaging unit and the second imaging unit.

2. The wire bonding apparatus according to claim 1, wherein the reference member has a first mark to be detected by the first imaging unit and a second mark to be detected by the second imaging unit.

3. The wire bonding apparatus according to claim 2, wherein the first mark is a tapered surface of the reference member.

4. The wire bonding apparatus according to claim 2, wherein the first mark is a step of the reference member.

5. The wire bonding apparatus according to claim 3, wherein
the reference member has an opening bottom portion surrounded by the tapered surface, and
the second mark is formed on the opening bottom portion.

6. The wire bonding apparatus according to claim 1, further comprising:
at the ball-shaped tip section of the wire, an irradiation unit, configured to irradiate each slit light in an XY axis direction parallel to the reference surface from the opposite side to the bonding tool, wherein
the control unit measures the change in the offset between the bonding tool and the first imaging unit based on each slit light in the XY axis direction.

7. The wire bonding apparatus according to claim 6, wherein the control unit measures at least one of a diameter and a shape of the ball-shaped tip section of the wire extended out from the bonding tool.

8. The wire bonding apparatus according to claim 1, wherein
the reference member has a light path length correcting unit, and
the second imaging unit detects the position of the ball-shaped tip section of the wire via the light path length correcting unit of the reference member.

9. The wire bonding apparatus according to claim 1, wherein the control unit provides feedback of the change in the offset and reflects it to next wire bonding.

10. The wire bonding apparatus according to claim 9, wherein the previously stored offset value is an offset value most recently measured by the control unit.

11. The wire bonding apparatus according to claim 1, wherein the control unit measures an oxidation level of the ball-shaped tip section of the wire based on the detection result of the second imaging unit.

12. The wire bonding apparatus according to claim 11, wherein if the measured oxidation level is high, the control unit provides feedback to a bonding parameter and reflects it to next wire bonding.

13. The wire bonding apparatus according to claim 11, wherein the second imaging unit detects a change associated with a movement of the ball-shaped tip section of the wire when moving the bonding tool in a vertical direction with respect to the reference surface.

14. A method of wire bonding a position of a bonding target on a reference surface, the method comprising:
a preparing step of a wire bonding apparatus comprising:
a bonding tool provided to be spaced from a first imaging unit;
a moving mechanism configured to integrally move the bonding tool and the first imaging unit in a direction parallel to the reference surface;
a reference member;
a second imaging unit arranged on the opposite side to the bonding tool and the first imaging unit with respect to the reference surface; and
a control unit configured to measure an offset between the bonding tool and the first imaging unit;
a step of forming a ball-shaped tip section on a wire extended out from the bonding tool;
a first detecting step of detecting a position of an optical axis of the first imaging unit with respect to a position of the reference member by the first imaging unit after moving the first imaging unit above the reference member;
a second detecting step of detecting the position of the reference member and detecting a position of the ball-shaped tip section of the wire by the second imaging unit after moving the bonding tool above the reference member according to a previously stored offset value; and
a measuring step of a change in the offset between the bonding tool and the first imaging unit based on each detection result of the first and second imaging units.

15. The wire bonding apparatus according to claim 4, wherein
 the reference member has an opening bottom portion surrounded by the step, and
 the second mark is formed on the opening bottom portion.

* * * * *